United States Patent
Ying et al.

(10) Patent No.: US 6,383,946 B1
(45) Date of Patent: May 7, 2002

(54) METHOD OF INCREASING SELECTIVITY IN SILICON NITRIDE DEPOSITION

(75) Inventors: Tzung-Hua Ying, Hualien Hsien; Tang Yu, Hsinchu Hsien; Tse-Wei Liu, Hsinchu; Cheng-Chieh Huang, Taipei Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/740,408

(22) Filed: Dec. 18, 2000

(51) Int. Cl.[7] ............................................. H01L 21/302
(52) U.S. Cl. ..................... 438/740; 438/238; 438/438; 438/510; 438/586; 438/749
(58) Field of Search .................................. 438/740, 749, 438/586, 439, 510, 238

(56) References Cited

U.S. PATENT DOCUMENTS

| | | | | |
|---|---|---|---|---|
| 4,252,860 A | * | 2/1981 | Brennan et al. ............. | 428/446 |
| 5,880,036 A | * | 3/1999 | Becker et al. .............. | 438/740 |
| 5,972,775 A | * | 10/1999 | Chen .......................... | 438/439 |
| 6,066,550 A | * | 5/2000 | Wang .......................... | 438/586 |

* cited by examiner

Primary Examiner—Amir Zarabian
Assistant Examiner—Pho Luu

(57) ABSTRACT

A method of increasing the selectivity of silicon nitride deposition. A substrate is provided. A silicon oxide layer is formed over a portion of the substrate. Ammonia $NH_3$ is passed over the silicon oxide layer and the substrate surface for a definite period to perform a surface treatment. Silicon nitride is subsequently deposited over the substrate and the silicon oxide layer.

13 Claims, 3 Drawing Sheets

NH₃ Treatment Conditions

METHOD OF INCREASING SELECTIVITY IN SILICON NITRIDE DEPOSITION

BACKGROUND OF THE INVENTION

1. Field of Invention

The present invention relates to a method of depositing silicon nitride. More particularly, the present invention relates to a method of increasing selectivity in silicon nitride deposition.

2. Description of Related Art

Silicon nitride is a dielectric material commonly used in semiconductor fabrication. Silicon nitride layer mainly serves as an etching mask for etching silicon oxide layer. In addition, because silicon nitride is a barrier for the diffusion of oxygen, the mask layer can also serve as a barrier for preventing oxidation of the active region of a silicon chip. Aside from these advantages, silicon nitride layer is also highly resistant to moisture penetration. Consequently, a silicon nitride layer is often used as a protective passivation layer over semiconductor devices. Because silicon nitride has so many useful applications, the process of forming silicon nitride layer over silicon chip is an important step.

At present, the reacting conditions for the formation of a silicon nitride layer over a silicon oxide layer and a substrate surface are such that thickness over each of the layers are almost identical. However, following the progress in semiconductor manufacturing technologies, process simplification is very important. The conventional method of forming silicon nitride layer cannot produce silicon nitride layer with different thickness over different type of surfaces in a single deposition step.

SUMMARY OF THE INVENTION

Accordingly, one object of the present invention is to provide a method of increasing selectivity in silicon nitride deposition. In other words, the ratio between the thickness of the silicon nitride layer formed over a silicon oxide layer and the thickness of the silicon nitride layer formed over a substrate surface in the same process is increased.

To achieve these and other advantages and in accordance with the purpose of the invention, as embodied and broadly described herein, the invention provides a method of increasing the selectivity of silicon nitride deposition. First, a substrate is provided. A silicon oxide layer is formed over a portion of the substrate. Ammonia $NH_3$ is passed over the silicon oxide layer and the substrate surface for a definite period to perform a surface treatment. Thereafter, silicon nitride is deposited over the substrate and the silicon oxide layer.

In this invention, a nitrogen-containing gas, preferably ammonia $NH_3$, is used to perform a surface treatment of the substrate surface and the silicon oxide surface. After the surface treatment, a single deposition step can be used to deposit silicon nitride to a different thickness over the silicon oxide layer and the substrate. Since there is no need to perform separate deposition steps to form a silicon nitride layer over the silicon oxide layer and the substrate, manufacturing is simplified.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
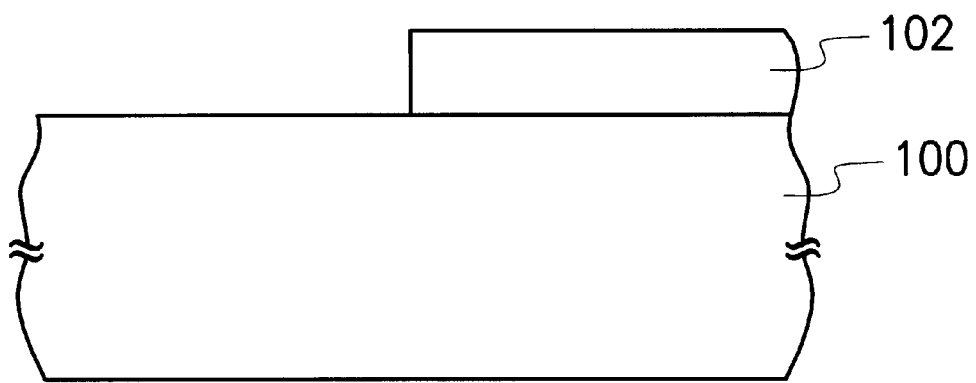
FIGS. 1 and 2 are schematic cross-sectional views showing the steps for forming a silicon nitride layer of different thickness over a silicon oxide layer and a substrate simultaneously according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
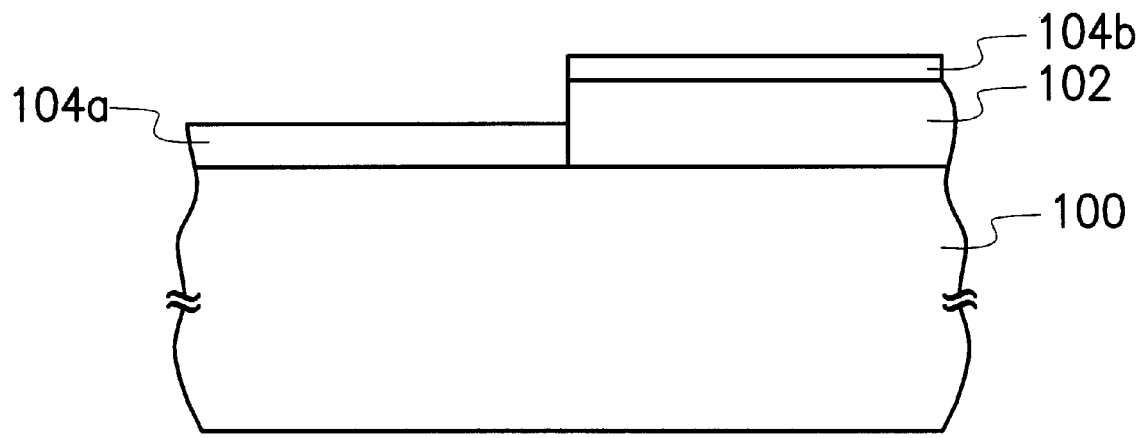

FIGS. 1 and 2 are schematic cross-sectional views showing the steps for forming a silicon nitride layer of different thickness over a silicon oxide layer and a substrate simultaneously according to one preferred embodiment of this invention.

As shown in FIG. 1, a substrate 100 is provided. The substrate 100 is preferably a semiconductor substrate such as a silicon substrate. Since a native oxide layer (not shown) can easily form over the substrate 100 surface, a series of cleaning steps are often conducted to remove the native oxide and obtain a pure silicon surface. The native oxide can be removed by placing the substrate 100 onto a tank 10 full of RCA cleaning solution using a robotic hand. The RCA solution is a cleaning agent that includes ammonium hydroxide ($NH_4OH$), hot de-ionized water (HDIW) and hydrogen peroxide ($H_2O_2$). At a common boiling temperature, the native oxide on the surface of the substrate 100 is removed. In the subsequent step, the substrate 100 is dipped into a hot quick-dump rise (HQDR) bath. Using large quantity of de-ionized water, any residual RCA solution from the substrate 100 is removed by rinsing. The substrate 100 is next immersed in a bath full of dilute hydrofluoric acid (HF) solution for a dilute hydrofluoric (DHF) acid treatment that removes not only the native oxide layer but also organic material and micro-particles.

A silicon oxide layer 102 is formed over a portion of the substrate 100. The silicon oxide layer 102 is formed, for example, by thermally oxidizing a portion of the substrate 100.

As shown in FIG. 2, a nitrogen-containing gas, preferably an ammonia ($NH_3$) gas, is used to perform a surface treatment. The ammonia gas is passed over the silicon oxide layer 102 and the substrate 100 for a pre-defined period. The surface treatment period can be varied according to demand. After treating the surface with ammonia for a period, silicon nitride is deposited over the substrate 100 and the silicon oxide layer 102 to form a silicon nitride layer 104a and a silicon nitride layer 104b. In the surface treatment process, a temperature of between 600° C. to 1000° C. and a pressure of between 0.3 torr to 760 torrs is preferably used. In the process of forming the silicon nitride layers 104a and 104b, a depositing pressure equal to or smaller than 0.3 torr is preferably used. If ammonia ($NH_3$) and dichloro-silicon hydride ($SiH_2Cl_2$) is the reactive gas for depositing silicon nitride, the ratio of the gas flow rates between the two can be equal to or greater than 3:1.

According to experimental results, after treating a surface with ammonia for a defined period, the silicon nitride layer 104a has a greater thickness than the silicon nitride layer 104b. Thickness difference ratio between the silicon nitride layer 104a and the silicon nitride layer 104b ranges from 50% to 120%. The thickness difference ratio is computed using the formula: (Tsi−Tox)/[(Tsi+Tox)/2], wherein Tsi is the thickness of silicon nitride on the substrate surface, that is, thickness of the silicon nitride layer 104a; Tox is the thickness of silicon nitride on the silicon oxide layer, that is, thickness of the silicon nitride layer 104b. To increase the thickness difference ratio between the silicon nitride layer 104a and the silicon nitride layer 104b further, depositing pressure can be lowered and/or flow rate of the gaseous reactants can be increased. In addition, the treatment period using ammonia can be increased or decreased according to actual need.

Figure 3:
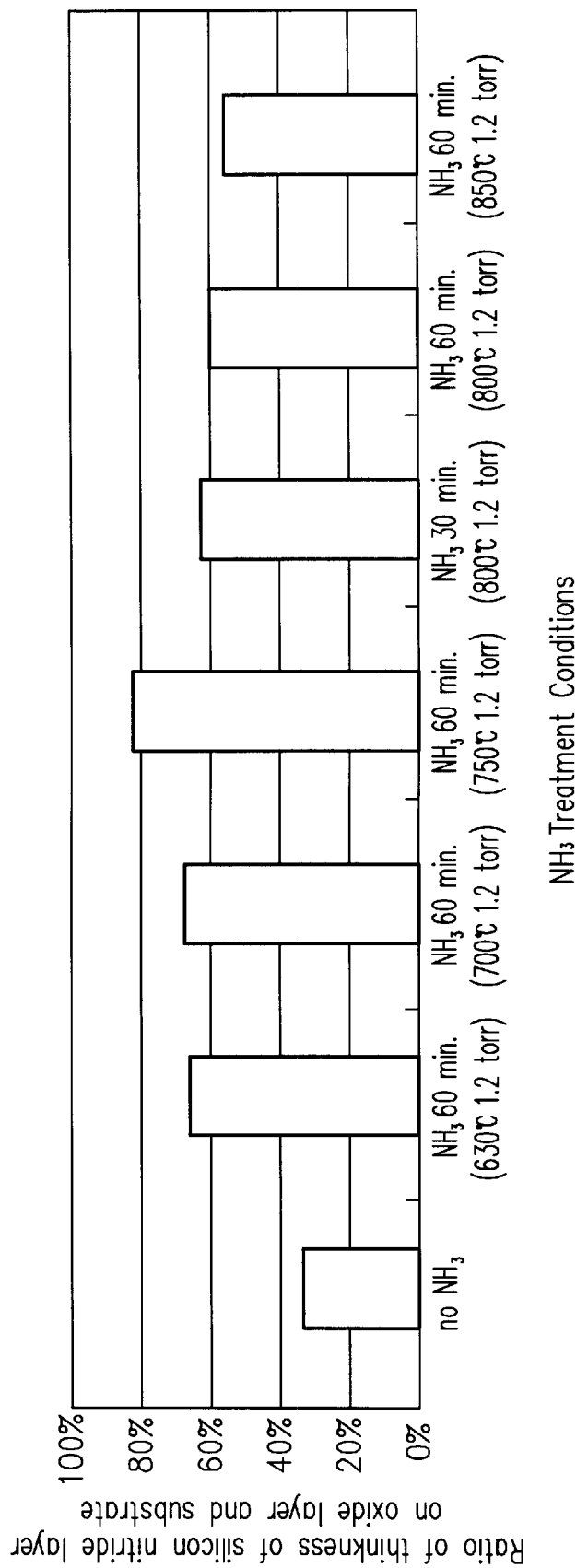
FIG. 3 is a bar chart showing the relationship between the treatment conditions with $NH_3$ and the ratio of thickness of the silicon nitride layer formed over an oxide layer and substrate.

FIG. 3 is a bar chart showing the relationship between the treatment conditions with $NH_3$ and the ratio of thickness of the silicon nitride layer formed over an oxide layer and substrate. As shown in FIG. 3, thickness difference ratio of the silicon nitride layer with ammonia treatment is much greater than one without ammonia treatment. The thickness difference ratio is computed using the formula: (Tsi−Tox)/[(Tsi+Tox)/2]. Tsi is the thickness of silicon nitride on the substrate 100 surface, that is, thickness of the silicon nitride layer 104a. Tox is the thickness of silicon nitride on the silicon oxide layer 102, that is, thickness of the silicon nitride layer 104b.

Figure 4:
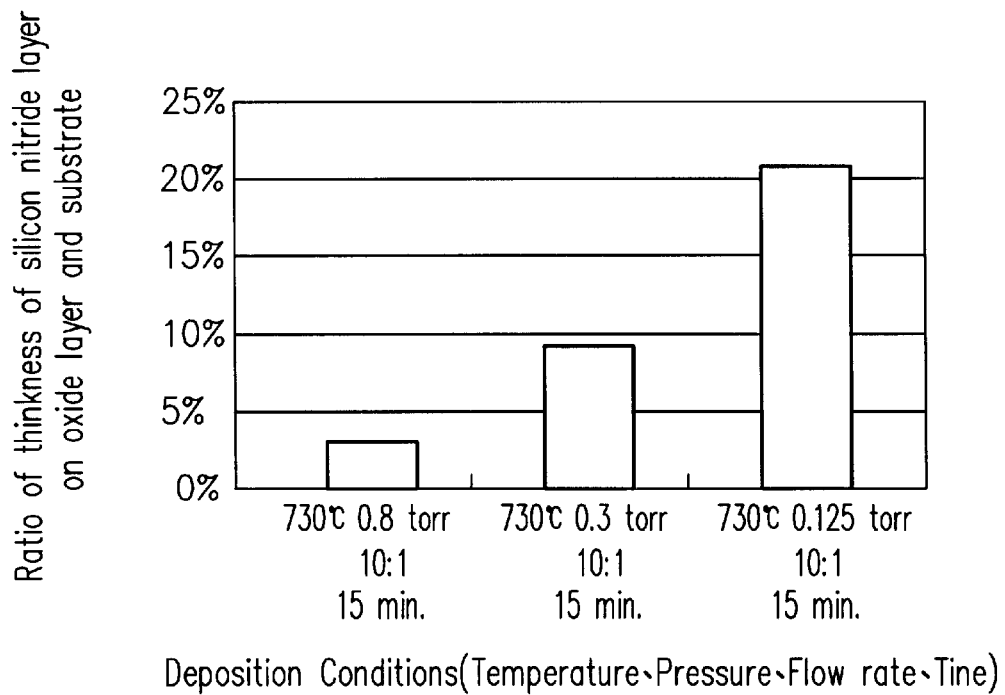
FIG. 4 is a bar chart showing the relationship between the pressure used in the deposition of silicon nitride and the ratio of thickness of the silicon nitride layer formed over an oxide layer and a substrate.

FIG. 4 is a bar chart showing the relationship between the pressure used in the deposition of silicon nitride and the ratio of thickness of the silicon nitride layer formed over an oxide layer and a substrate. As shown in FIG. 4, the thickness difference ratio of the silicon nitride layer is the greatest at a pressure of 0.125 torr. In other words, the lower the depositing pressure, the greater will be the thickness difference ratio of the deposited silicon nitride layer over a silicon oxide layer and a substrate.

Figure 5:
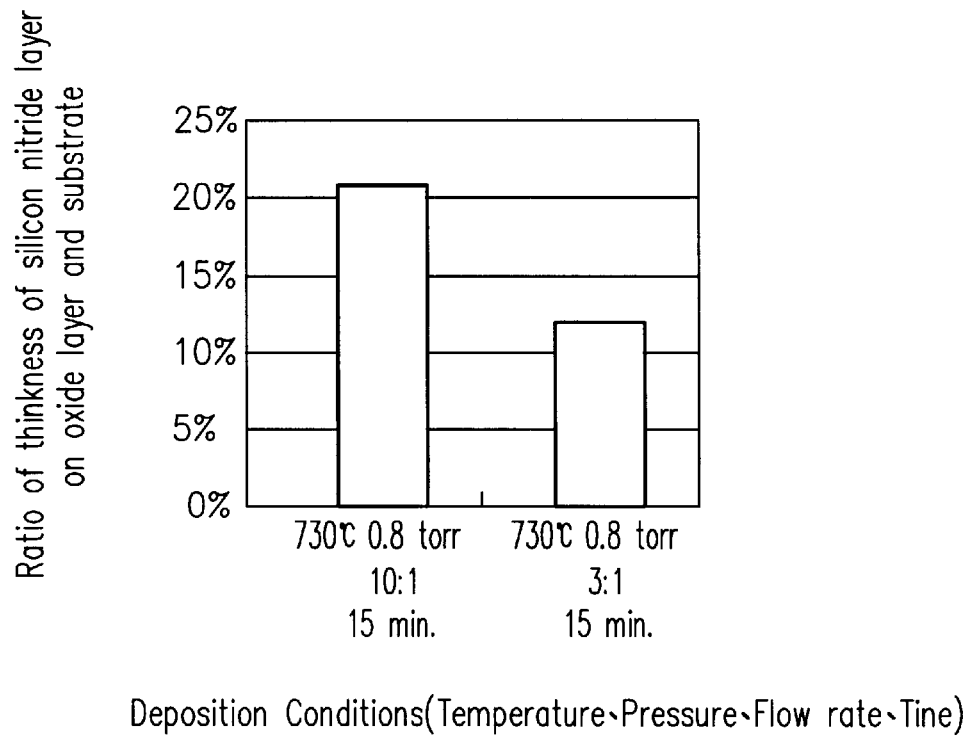
FIG. 5 is a bar chart showing the relationship between the relative gas flow rates in the deposition of silicon nitride and the ratio of thickness of the silicon nitride layer formed over an oxide layer and a substrate.

FIG. 5 is a bar chart showing the relationship between the relative gas flow rates in the deposition of silicon nitride and the ratio of thickness of the silicon nitride layer formed over an oxide layer and a substrate. As shown in FIG. 5, the relative gas flow rate is between ammonia and dichloro-silicon hydride. According to experiment, the higher the relative flow rates of the two gaseous reactants, the greater will be the thickness difference ratio of the deposited silicon nitride layer over a silicon oxide layer and a substrate.

In this invention, ammonia $NH_3$ is used to perform a surface treatment of the substrate surface and the silicon oxide surface. After the surface treatment, a single deposition step can be used to deposit silicon nitride to a different thickness over the silicon oxide layer and the substrate. Since there is no need to perform separate deposition steps to form a silicon nitride layer over the silicon oxide layer and the substrate, manufacturing is simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of increasing the selectivity in silicon nitride deposition, comprising the steps of:

providing a substrate;

forming a silicon oxide layer over a portion of the substrate;

performing a surface treatment by passing ammonia (NH3) over the substrate and the silicon oxide layer for a pre-defined period of time; and depositing silicon nitride over the substrate and the silicon oxide layer to simultaneously form a first silicon nitride layer and a second silicon nitride layer respectively.

2. The method of claim 1, wherein the substrate includes a silicon substrate.

3. The method of claim 1, wherein the step of forming the silicon oxide layer includes thermal oxidation.

4. The method of claim 1, wherein the step of performing the surface treatment includes heating to a temperature between about 600° C. to 1100° C.

5. The method of claim 1, wherein the step of performing the surface treatment includes passing ammonia at a pressure of between about 0.3 torr to 760 torrs.

6. The method of claim 1, wherein the step of depositing silicon nitride over the substrate and the silicon oxide layer includes using ammonia ($NH_3$) and dichloro-silicon hydride ($SiH_2Cl_2$) as the reactive gases.

7. The method of claim 1, wherein the first silicon nitride layer has a thickness greater than the second silicon nitride layer.

8. A method of increasing the selectivity of silicon nitride deposition, comprising the steps of:

providing a substrate;

forming a silicon oxide layer over a portion of the substrate;

performing a surface treatment by passing a nitrogen-containing gas over the substrate; and depositing silicon nitride to simultaneously form a first silicon nitride layer over the substrate and a second silicon nitride layer over the silicon oxide layer, wherein the first silicon nitride layer has a thickness greater than the second silicon nitride layer.

9. The method of claim 8, wherein the substrate includes a silicon substrate.

10. The method of claim 8, wherein the step of forming the silicon oxide layer includes thermal oxidation.

11. The method of claim 8, wherein the step of performing the surface treatment includes heating to a temperature between about 600° C. to 1100° C.

12. The method of claim 8, wherein the step of performing the surface treatment includes passing ammonia at a pressure of between about 0.3 torr to 760 torrs.

13. The method of claim 8, wherein the step of depositing silicon nitride over the substrate and the silicon oxide layer includes using ammonia ($NH_3$) and dichloro-silicon hydride ($SiH_2Cl_2$) as the reactive gases.

* * * * *